(12) United States Patent
Khanolkar et al.

(10) Patent No.: US 11,482,477 B2
(45) Date of Patent: Oct. 25, 2022

(54) PACKAGED ELECTRONIC DEVICE WITH SUSPENDED MAGNETIC SUBASSEMBLY

(71) Applicant: Texas Instruments Incorporated, Dallas, TX (US)

(72) Inventors: Vijaylaxmi Khanolkar, Pune (IN); Joyce Mullenix, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 244 days.

(21) Appl. No.: 16/236,730

(22) Filed: Dec. 31, 2018

(65) Prior Publication Data

US 2020/0211939 A1 Jul. 2, 2020

(51) Int. Cl.
*H01L 23/495* (2006.01)
*H01L 23/31* (2006.01)
*H01L 23/00* (2006.01)

(52) U.S. Cl.
CPC .... *H01L 23/49575* (2013.01); *H01L 23/3107* (2013.01); *H01L 23/4951* (2013.01); *H01L 23/49555* (2013.01); *H01L 24/48* (2013.01); *H01L 2224/48175* (2013.01); *H01L 2224/48195* (2013.01); *H01L 2924/19042* (2013.01)

(58) Field of Classification Search
CPC ............. H01L 23/3107; H01L 23/4951; H01L 23/49555; H01L 24/48; H01L 23/49503; H01L 23/49506; H01L 23/49513; H01L 23/5227; H01L 23/645; H01L 33/62; H01L 27/0629; H01L 27/0727; H01L 23/49575; H01L 2224/48175; H01L 2224/48195; H01L 2924/19042; H01L 24/05; H01L 2224/05554; H01L 2224/48091; H01L 2224/48247; H01L 2224/73265;
(Continued)

(56) References Cited

U.S. PATENT DOCUMENTS 9,035,422 B2  5/2015  Khanolkar et al.
9,759,580 B2  9/2017  Mullenix
(Continued)

OTHER PUBLICATIONS

Park et al., "Ferrite-Based Integrated Planar Inductors and Transformers Fabricated at Low Temperatures", IEEE Transactions on Magnetics, vol. 33, No. 5, Sep. 1997, 3 pages.
(Continued)

*Primary Examiner* — Kimberly N Rizkallah
*Assistant Examiner* — Dilinh P Nguyen
(74) *Attorney, Agent, or Firm* — Ronald O. Neerings; Charles A. Brill; Frank D. Cimino

(57) ABSTRACT

A packaged electronic device includes a die pad directly connected to a first set of conductive leads of a leadframe structure, a semiconductor die attached to the conductive die pad, a conductive support structure directly connected to a second set of conductive leads, and spaced apart from all other conductive structures of the leadframe structure. A magnetic assembly is attached to the conductive support structure, and a molded package structure that encloses the conductive die pad, the conductive support structure, the semiconductor die, the magnetic assembly and portions of the conductive leads, the molded package structure including a top side, and an opposite bottom side, wherein the lamination structure is centered between the top and bottom sides.

22 Claims, 7 Drawing Sheets

(58) Field of Classification Search
CPC ..... H01L 2924/00014; H01L 2924/181; H01L 23/495; H01L 23/49551
USPC ................................................ 257/676, 277
See application file for complete search history.

(56) References Cited

U.S. PATENT DOCUMENTS

| | | |
|---|---|---|
| 2006/0152911 A1 | 7/2006 | Humbert et al. |
| 2009/0160595 A1 | 6/2009 | Feng et al. |
| 2015/0069572 A1* | 3/2015 | Khanolkar ............ H01L 23/645 257/531 |
| 2015/0280785 A1* | 10/2015 | Brauchler ............ H04B 5/0018 257/531 |
| 2016/0069662 A1 | 3/2016 | Mullenix et al. |
| 2017/0059364 A1 | 3/2017 | Mullenix |
| 2017/0178787 A1 | 6/2017 | Massolini et al. |
| 2017/0194088 A1 | 7/2017 | Massolini et al. |
| 2018/0190573 A1 | 7/2018 | Mullenix et al. |

OTHER PUBLICATIONS

Brandon et al., "Printed Microinductors on Flexible Subsliates for Power Applications", IEEE Transactions on Components and Packaging Technologies, vol. 26, No. 3, Sep. 2003, 7 pages.

* cited by examiner

PACKAGED ELECTRONIC DEVICE WITH SUSPENDED MAGNETIC SUBASSEMBLY

BACKGROUND

Modern packaged electronic devices sometimes include integrated passive circuit components, such as transformers, inductors and/or other passive components, with internal electrical connections to semiconductor dies and to externally accessible leads (e.g., pins or pads) for soldering to a printed circuit board (PCB). Transformer or inductor coils can be fabricated in a lamination structure for integration in a packaged electronic device. High voltage isolation is sometimes needed for isolated power transformer applications, and certain product design specifications call for high voltage withstanding performance (e.g., above 5 kV rms). Existing integrated devices include laminated magnetic components mounted to an asymmetrical lead frame die attach pad, which can lead to small internal spacing distances and high electric field intensity levels (e.g., 3 V/um external in air) between the die attach pad and package leads connected to a different power domain. For example, certain leads of the electronic component package may be connected to a high voltage primary circuit of an isolated power converter, whereas the die attach pad may be connected to a low voltage secondary circuit. Excessive voltage differentials between the primary and secondary can cause external arcing at the high voltage leads during manufacturing testing. Simply increasing the spacing in an asymmetrical design can reduce the area available for integrated magnetics circuitry, and this approach is not scalable as each design needs custom optimization with respect to electric fields, efficiency and electromagnetic interference (EMI) performance. Moreover, increasing the vertical thickness of laminated magnetic components mounted on a solid die attach pad may lead to problems with complex mold flow during manufacturing, resulting in mold voids in the package assembly process.

SUMMARY

Described examples include packaged electronic devices with a die pad connected to a first set of conductive leads of a leadframe structure, and a semiconductor die attached to the conductive die pad. A conductive support structure is connected to a second set of conductive leads, and spaced apart from all other conductive structures of the leadframe structure. A magnetic stacked assembly is attached to the conductive support structure, and a package structure encloses the conductive die pad, the conductive support structure, the semiconductor die, the magnetic assembly and portions of the conductive leads. In one example, the magnetic assembly includes a lamination structure with a patterned conductive feature that forms a part of a passive electronic component, and core structures attached to first and second sides of the lamination structure, where the lamination structure is attached to the conductive support structure. In one example, the device includes multiple conductive die pads and attached semiconductor dies. Certain examples include bond wires or other connections between one or more conductive features of the second semiconductor die and conductive leads of the leadframe structure, and/or between conductive features of the semiconductor die and conductive feature of the magnetic assembly. In one example, the conductive support structure includes first and second conductive support members, and the magnetic assembly is attached to the first and second conductive support members. In one example, the magnetic assembly is centered between first and second lateral sides of the package structure. In one example, the lamination structure is centered between the top and bottom sides of the package structure.

A method is described for fabricating an electronic device, including attaching a magnetic assembly to a conductive support structure of a lead frame structure, attaching a semiconductor die to a conductive die pad of the lead frame structure, forming a connection between a first conductive feature of the semiconductor die and a conductive lead, and forming a second connection between a second conductive feature of the semiconductor die and a conductive feature of the magnetic assembly. The method also includes enclosing the conductive die pad, the conductive support structure, the semiconductor die, the magnetic assembly and portions of the conductive leads in a package structure.

DETAILED DESCRIPTION

Figure 1:
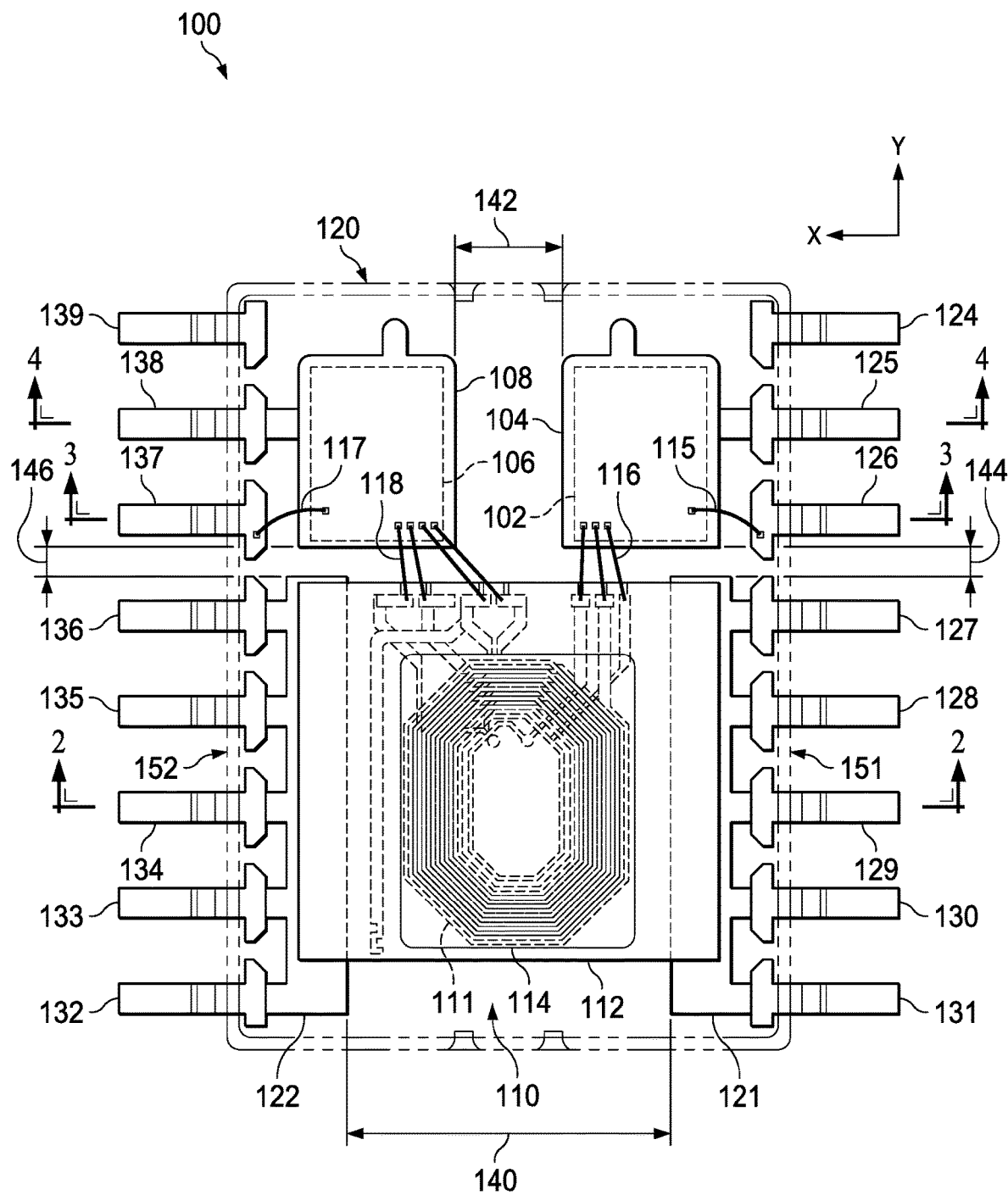
FIG. 1 is a bottom view of a packaged electronic device with a suspended magnetic assembly.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections.

FIGS. 1-6 show an example packaged electronic device 100 with a laminated magnetic assembly suspended on a conductive support structure spaced apart from integrated semiconductor dies and associated conductive die pads. The example device 100 provides a symmetrically located magnetic assembly to facilitate reduced electric field levels and enhanced high voltage withstand ratings without adversely affecting mold material flow during fabrication, and provides a cost-effective scalable solution to the above-described problems.

Figure 2:
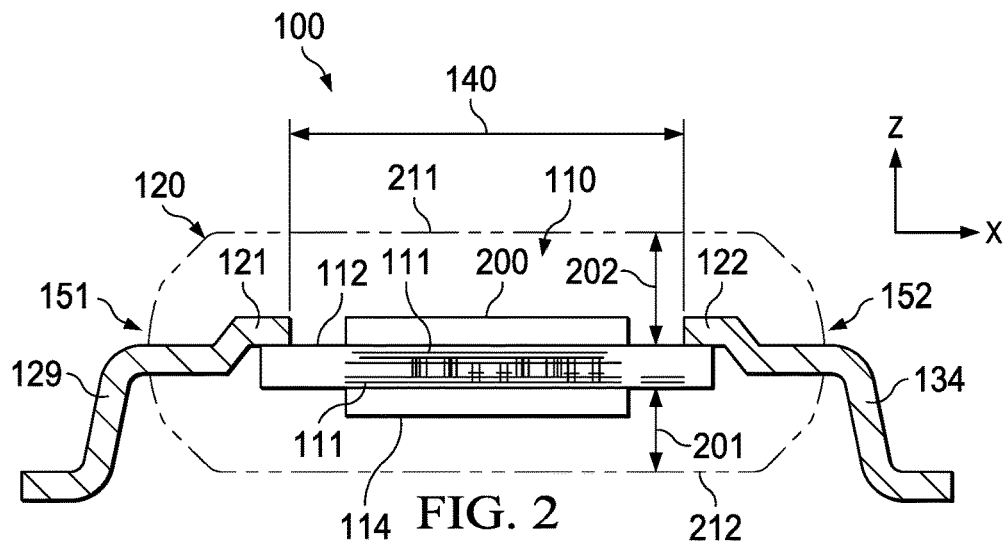
FIG. 2 is a partial sectional end view of the packaged electronic device taken along line 2-2 of FIG. 1.
Figure 3:
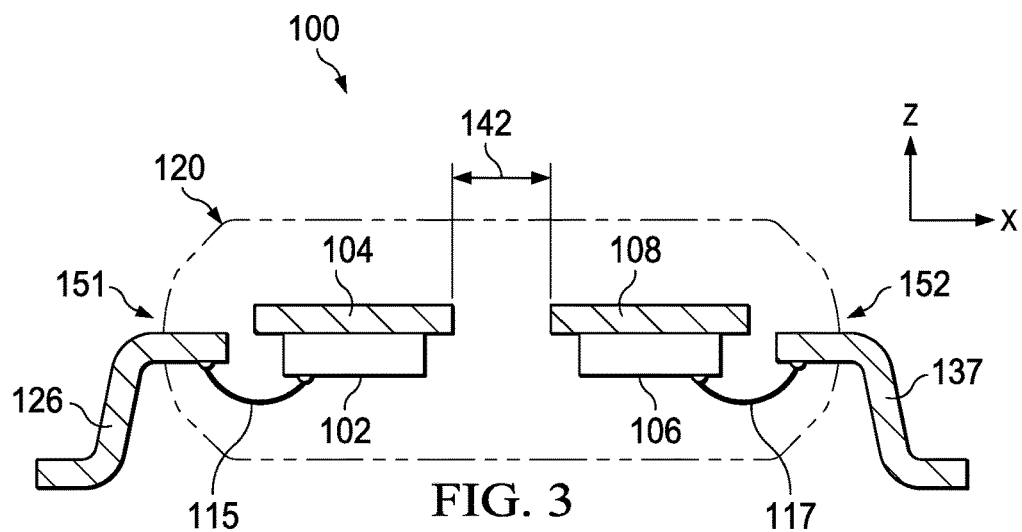
FIG. 3 is a partial sectional end elevation view of the packaged electronic device taken along line 3-3 of FIG. 1.
Figure 4:
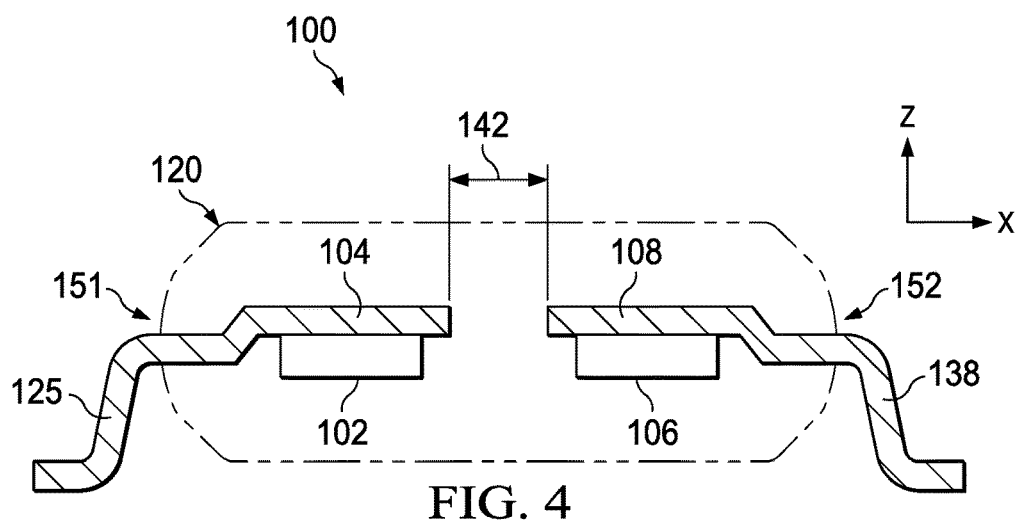
FIG. 4 is a partial sectional end view of the packaged electronic device taken along line 4-4 of FIG. 1.
Figure 5:
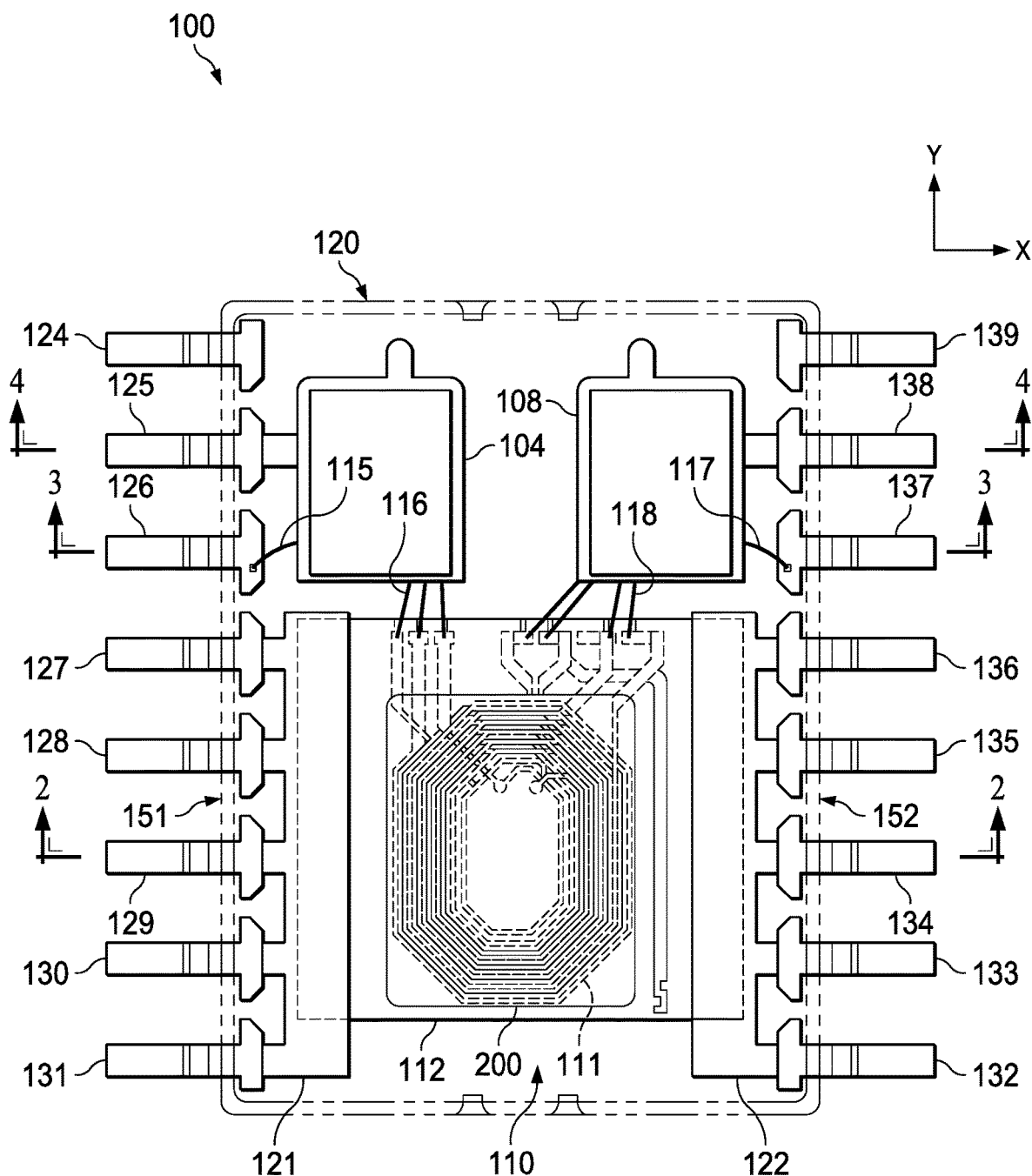
FIG. 5 is a top view of the packaged electronic device of FIGS. 1-4.

FIG. 1 shows a bottom view of the example device 100, and FIGS. 2-4 show partial sectional and elevation views along the respective lines 2-2, 3-3, and 4-4 in FIG. 1. FIG.

Figure 6:
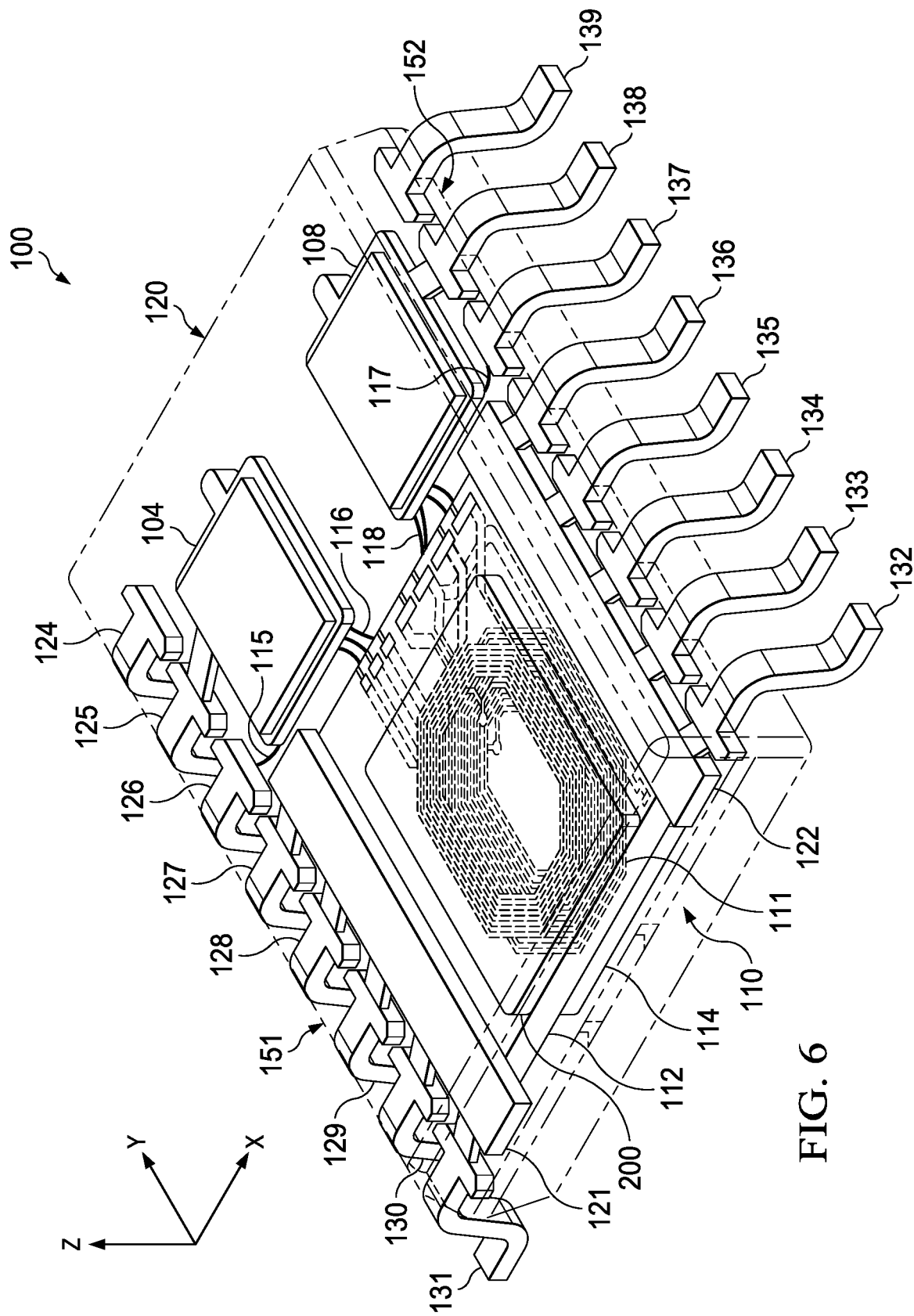
FIG. 6 is a top perspective view of the packaged electronic device of FIGS. 1-5.

5 shows a top view, and FIG. 6 shows a top perspective view of the packaged electronic device 100. As shown in FIG. 1, the device 100 includes a lead frame structure with physically spaced apart conductive features for mounting one or more semiconductor dies and a laminated magnetic assembly. The lead frame assembly can include any suitable conductive structures, such as copper, aluminum, etc. The example device 100 in FIG. 1 includes a first semiconductor die 102 attached to a first conductive die pad 104 of the lead frame assembly. Certain implementations can include a single semiconductor die 102 attached to a single conductive die pad 104. In other implementations, multiple semiconductor dies and associated die pads can be included in the device 100. The example device 100 in FIG. 1 includes a second semiconductor die 106 attached to a second conductive die pad 108 of the lead frame structure.

The packaged electronic device 100 also includes a laminated magnetic assembly 110 attached to a conductive support structure of the lead frame assembly. The laminated magnetic assembly 110 includes a patterned conductive feature 111 in a lamination structure 112. In certain implementations, the lamination structure 112 can include a single pattern conductive feature, for example, to form an inductor winding. In other examples, one or more patterned conductive features can form a capacitor, a resistor or other passive component in the lamination structure 112. In the illustrated example, the lamination structure includes multiple conductive features that form primary and secondary windings of a transformer. The magnetic assembly 110 also includes one or more core structures to facilitate forming a magnetic circuit in combination with the patterned conductive feature 111. The illustrated example includes a first (lower or bottom) core structure 114 as seen in FIG. 1, as well as a second (upper or top) core structure 200 (seen in FIGS. 2 and 5). The first core structure 114 is attached to a first side of the lamination structure 112, and the second core structure 200 is attached to a second side of the lamination structure 112. In one example, the first magnetic core structure 114 is the same size as the second core structure 200. In another example, the first magnetic core structure 114 is larger than the second core structure 200. In another example, the first magnetic core structure 114 is smaller than the second core structure 200. In one example, one or both of the magnetic core structures 114, 200 are pre-fabricated magnetic cores attached using epoxy paste. In another example, one or both of the magnetic core structures 114, 200 are fabricated using a thick layer of magnetic paste.

The lamination structure 112 in one example is a multilayer structure with patterned conductive features 111 that form parts of a passive transformer electronic component. In one example, a first patterned conductive feature 111 forms a transformer primary winding, a second patterned conductive feature forms a first transformer secondary winding, and a further patterned conductive feature forms a second secondary winding. The patterned conductive features in one example have components on multiple layers of a multilayer lamination structure 112, although not required of all possible implementations. In one example, the patterned winding turns of the individual primary and secondary windings extend on different layers of the lamination structure 112, although not required of all possible implementations. The example patterned winding features include multiple turns in a spiral pattern on the individual layers of the lamination structure 112, although other implementations are possible, such as single turn winding structures on a single layer.

The upper and lower core structures 200, 114 are attached to the lamination structure 112 by epoxy or other suitable attachment structures and/or techniques to form a magnetically coupled transformer apparatus. In other examples, one of the upper or lower core structures 200, 114 can be omitted, with the remaining core structure providing magnetic coupling for the passive electronic component or components of the device 100. In other transformer examples, the lamination structure includes the winding 111 and a single secondary winding, and the further secondary winding can be omitted. In other examples, a single patterned conductive feature 111 can be provided to form a single conductive winding of an inductor, and the inductor winding is magnetically coupled with one or more core structures via magnetic adhesive layer material. In another example, a passive capacitor electronic component can be constructed, in which the lamination structure 112 includes first and second capacitor plates separated by a dielectric material of the multilayer lamination structure.

The example patterned conductive features forming the transformer primary and secondary windings include conductive end connection features allowing interconnection of the windings to pins or semiconductor dies of the device 100, such as for bond wire connections 115, 116, 117 and 118 in the packaged electronic device 100. The semiconductor dies 102 and 106 include pillars, solder bumps, conductive landing pads or other conductive features that can be electrically interconnected to other structures using bond wires 115, 116, 117 and 118 or through direct soldering using any suitable electrical interconnection technology.

The packaged electronic device 100 also includes a package structure 120 that encloses the conductive die pads 104 and 108, the semiconductor dies 102 and 106, the magnetic assembly 110, and all or portions of other conductive features of the leadframe structure. In one example, the package structure 120 is or includes a molded material, such as plastic. In another example, the package structure 120 is or includes a ceramic material.

The leadframe structure in the example device 100 also includes a conductive support structure with a conductive first support member 121 and a conductive second support member 122. The lamination structure 112 is attached to bottom sides or surfaces of the interior portions of the first and second conductive support members 121 and 122 as best shown in FIG. 2.

The leadframe structure further includes conductive leads 124, 125, 126, 127, 128, 129, 130, 131, 132, 133, 134, 135, 136, 137, 138, and 139. The package structure 120 encloses the conductive support structure members 121, 122, and encloses inner portions of the conductive leads 124-139. The conductive leads 124-139 in one example are so-called gull wing leads that extend downward and outward from the package structure 120 as shown in FIGS. 2-4 and 6. Different types and shapes of conductive leads can be used in other examples.

As best shown in FIG. 1, the first conductive die pad 104 is directly connected to a first set 125 of the conductive leads 124-139. In the illustrated example, the first set includes a single lead 125. In other examples, the die pad 104 is directly connected to multiple conductive leads. In the example device 100, the die pad 104 and the lead 125 are a single continuous metal structure, such as copper or aluminum.

The conductive support structure 121, 122 is directly connected to a second set of the conductive leads 127-131, and 132-136. In addition, the conductive support structure 121, 122 is spaced apart from all other conductive structures of the leadframe structure. In the illustrated example, the first conductive support member 121 is directly connected to a first group 127-131 of the second set of the leads, and the first conductive support member 121 is spaced apart from all other conductive structures of the leadframe structure. In the illustrated example, the first group of the second set includes multiple leads 127-131. In other examples, the first group of the second set includes a single lead. In the example device 100, the first conductive support member 121 and the leads 127-131 are a single continuous metal structure, such as copper or aluminum. The second conductive support member 122 is directly connected to a second group 132-136 of the second set of the leads 124-139, and the second conductive support member 122 is spaced apart from all other conductive structures of the leadframe structure. In the illustrated example, the second group of the second set includes multiple leads 132-136. In other examples, the second group of the second set includes a single lead. In the example device 100, the second conductive support member 122 and the leads 132-136 are a single continuous metal structure, such as copper or aluminum.

The second conductive die pad 108 is directly connected to a third set of the conductive leads, and the second conductive die pad 108 is spaced apart from the conductive support structure 121, 122. In the illustrated example, the third set includes a single lead 138. In other examples, the second die pad 108 is directly connected to multiple conductive leads. In the example device 100, the second die pad 108 and the lead 138 are a single continuous metal structure, such as copper or aluminum.

The example packaged electronic device 100 in FIGS. 1-6 includes a transformer isolated circuit with a high voltage primary side and a lower voltage secondary side. In this example, the high voltage primary side circuitry includes the leads 124-131, the first semiconductor die 102, the first die pad 104 and the first support member 121. As best seen in FIGS. 1, 3, 5 and 6, the primary circuitry also includes a first bond wire 115 connected between the semiconductor die 102 and a first conductive lead 126, as well as a second bond wire 116 connected between the semiconductor die 102 and the magnetic assembly 110.

The low voltage secondary side circuitry includes the leads 132-139, the second semiconductor die 106, the second die pad 108 and the second support member 122. The low voltage secondary side circuitry also includes a third bond wire 117 that is connected between the second semiconductor die 106 and a second conductive lead 137 of the conductive leads 124-139, as well as a fourth bond wire 118 that is connected between the second semiconductor die 106 and the magnetic assembly 110.

The voltage withstanding performance of the device 100, with respect to the isolated primary and secondary circuitry, is affected by the separation distances between the conductive structures associated with the primary and secondary side circuits. As best shown in FIGS. 1 and 2, the first conductive support member 121 is laterally spaced apart (e.g., along the X direction) from the second conductive support member 122 by a distance 140. In addition, the conductive die pads 104 and 108 are spaced apart from one another by a lateral distance 142 (FIGS. 1, 3 and 4), the first die attach pad 104 and the first support member 121 are spaced apart from one another (e.g., along the Y direction) by a longitudinal distance 144, and the second die attach pad 106 and the second support member 122 are spaced apart from one another by a longitudinal distance 146. In one example, the distances 144 and 146 are equal, although not a strict requirement of all implementations.

As the laminated magnetic assembly 110 is suspended by attachment to the laterally spaced support members 121 and 122, the high and low voltage circuits are spaced from one another by the smaller of the lateral distances 140 and 142. These distances are greater than the minimum spacing distance that would result if the laminated magnetic assembly 110 were instead mounted to a wide extended portion of one of the die attach pads 104 or 108. For example, if the low voltage second die pad 108 was extended downward in the negative Y direction and laterally along the negative X direction to support the laminated magnetic assembly 110, the lateral (X direction) spacing between the extended die pad 108 and the high voltage leads 127-131 would be significantly less than the smaller of the lateral distances 140 and 142 in the example device 100. Accordingly, the voltage withstanding performance of the device 100 is improved compared to devices that mount integrated magnetic components on a die attach pad.

As further shown in FIGS. 1-6, the package structure 120 includes a first lateral side 151 and an opposite second lateral side 152. In this example, the outer portions of the individual conductive leads 124-131 (of the high voltage primary side circuitry) extend outward from the package structure 120 along the first side 151, and the outer portions of the individual conductive leads 132-139 (of the low voltage secondary side circuitry) extend outward from the second side 152 of the package structure 120. In addition, the example laminated magnetic assembly 110 is laterally centered between the first and second lateral sides 151 and 152.

As best shown in FIG. 2, the example package structure 120 includes a top side 211 and an opposite bottom side 212. The lamination structure 112 is spaced from the bottom side 212 by a first vertical (e.g., Z direction) spacing distance 201. The lamination structure 112 is spaced from the top side 211 by a second vertical spacing distance 202. In one example, the distances 201 and 202 are equal, and the lamination structure 112 is centered between the top and bottom sides 211 and 212. The vertical and lateral centering in certain examples facilitates enhanced voltage withstanding performance of the circuit with respect to reduced electric fields compared with asymmetrical designs.

Referring now to FIGS. 7-13, FIG. 7 shows a method 700 for fabricating a an electronic device, such as the device 100 of FIGS. 1-6. FIGS. 8-13 show the example packaged electronic device 100 undergoing fabrication according to the method 700. The method 700 includes fabricating a laminated magnetic assembly at 701. In certain implementations, the magnetic assembly is separately assembled and provided as an input to the method 700.

Figure 8:
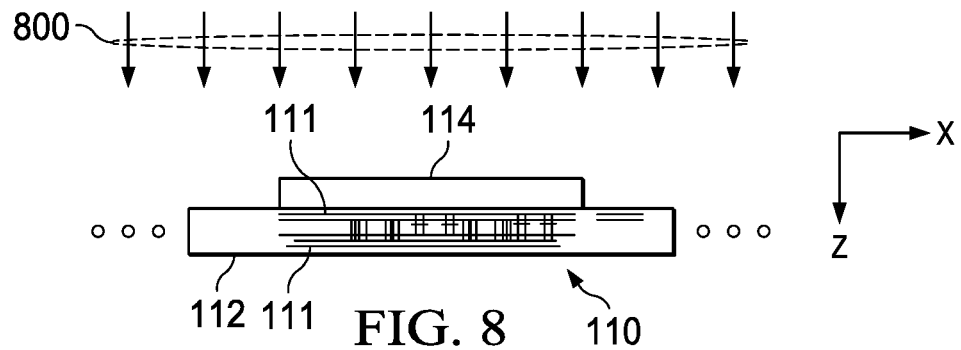
FIGS. 8-13 are partial sectional end elevation views of the packaged electronic device undergoing fabrication according to the method of FIG. 7.

In the illustrated example, the magnetic assembly at 701 includes attaching a bottom magnetic sheet on a back side of laminate structure at 702. FIG. 8 shows one example, in which an attachment process 800 is performed that attaches the first (lower or bottom) core structure 114 to a bottom side of the example lamination structure 112. The laminate structure 112 can be any suitable single or multi-layer lamination with one or more pattern conductive features 111, such as inductor or transformer windings. The pattern conductive features 111, in turn, can be created by any suitable processing, such as screen printing conductive material onto a laminate layer. The lamination structure 112 can include one or more bonding steps to bond laminate layers or sheets to one another to form the lamination structure 112. The core structure 114 in one example is a magnetic sheet structure, although not required of all possible implementations.

The attachment process 800 can include deposition of an epoxy or other adhesive onto the bottom surface of the lamination structure and/or onto the surface of the core structure 114. The adhesive in one example is printed magnetic ink epoxy, although non-magnetic adhesives can be used in other examples. The attachment process 800 also includes bringing the core structure 114 into contact with the bottom side of the lamination structure 111 and/or into contact with the epoxy formed thereon. The attachment process 800 in one example also includes any necessary curing steps (e.g., thermal, optical, ultraviolet (UV), etc.).

Figure 9:
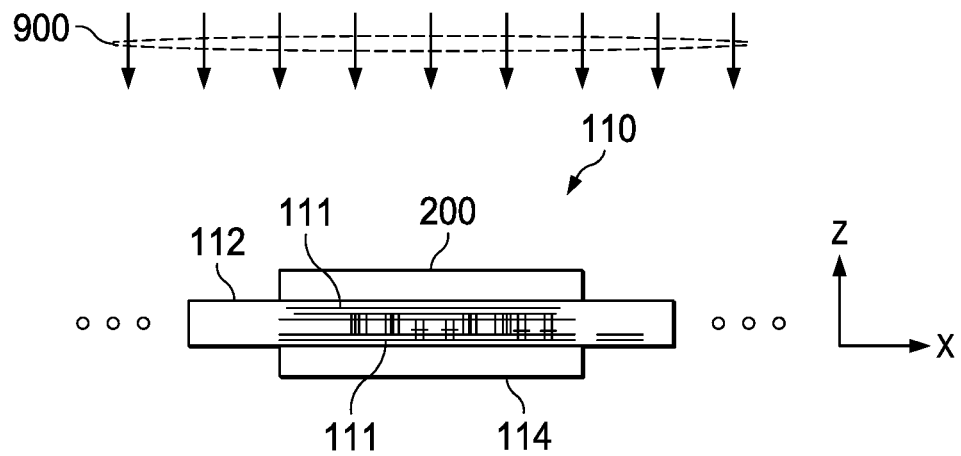

The example method 700 continues at 704 with attaching a top magnetic sheet on the front side of the lamination structure. FIG. 9 shows one example, in which a second attachment process 900 is performed that attaches the second (upper or top) core structure 200 to a second side of the lamination structure 112. The attachment process 900 can be the same or similar process as the first attachment process 800 use to attach the first core structure 114 to the lamination structure 112.

Figure 10:
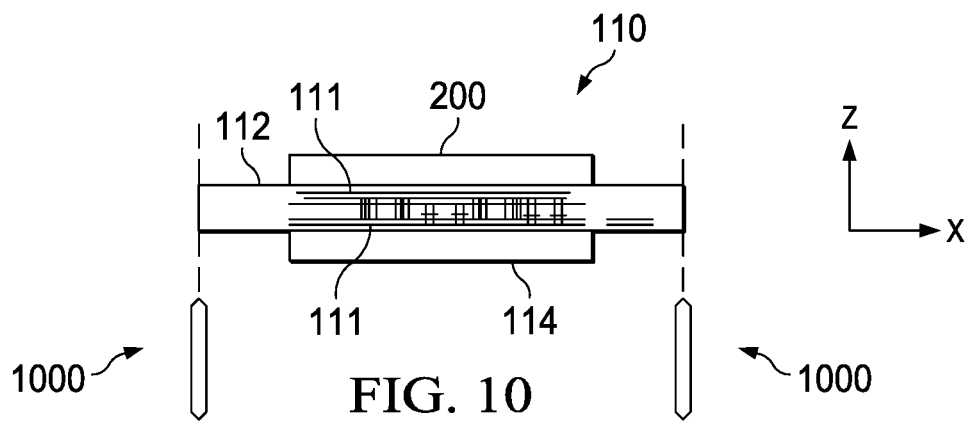

At 706, the method 700 further includes singulating the magnetic assembly. In one example, the magnetic assembly process is used to concurrently fabricate multiple laminated magnetic assemblies, such as using a single large lamination structure 112, and attachment of one or more core structures 114, 200 to opposite sides thereof. FIG. 10 shows one example in which such a large lamination structure 112 is diced or cut to singulate or separate individual laminated magnetic assemblies from the initial unitary structure. A singulation process 1000 is performed in the example of FIG. 10, which singulates or separates multiple laminated magnetic assemblies from a starting unitary structure, for example, using a saw blade, etching, laser cutting, etc.

The method 700 continues at 708 with providing a lead frame structure that includes conductive leads, one or more conductive die pads, a set of conductive leads, and a conductive support structure. In one implementation, the leadframe structure is provided on a tacky tape or other adhesive carrier, with the various constituent structures assembled in a predetermined relative arrangement to facilitate subsequent assembly steps in the method 700.

In one example, as discussed above, the conductive support structure is directly connected to a set of the leads and is spaced apart from all other conductive structures of the lead frame structure. In the example of FIGS. 1-6 above, the lead frame structure includes conductive features 104, 108, 121, 122, and 124-139. Various conductive features in this example are directly connected to one another by formation as a single unitary structure, such as a continuous copper or aluminum structure. In one example, these continuous conductive structures are arranged at 708 on the adhesive carrier in a predetermined arrangement relative to one another.

In the example of FIG. 1 above, the first conductive die pad 104 is connected to a first set 125 of conductive leads 124-139, and a conductive support structure is connected to a second set 127-131, 132-136 of the conductive leads and is spaced apart from all other conductive structures of the leadframe structure. In the example of FIG. 1, the conductive support structure includes the first and second conductive support members 121 and 122. The first conductive support member 121 is directly connected to the first group 127-131 of the second set of the leads, and the first conductive support member 121 is spaced apart from all other conductive structures of the leadframe structure. As shown in FIG. 1, moreover, the example second conductive support member 122 is directly connected to the second group 132-136 of the second set of the leads, and the second conductive support member 122 is spaced apart from all other conductive structures of the leadframe structure. Where included, the second conductive die pad 108 is directly connected to a third set of the conductive leads (e.g., a single lead 138 in FIG. 1), and the second conductive die pad 108 is spaced apart from the conductive support structure 121, 122.

Figure 11:
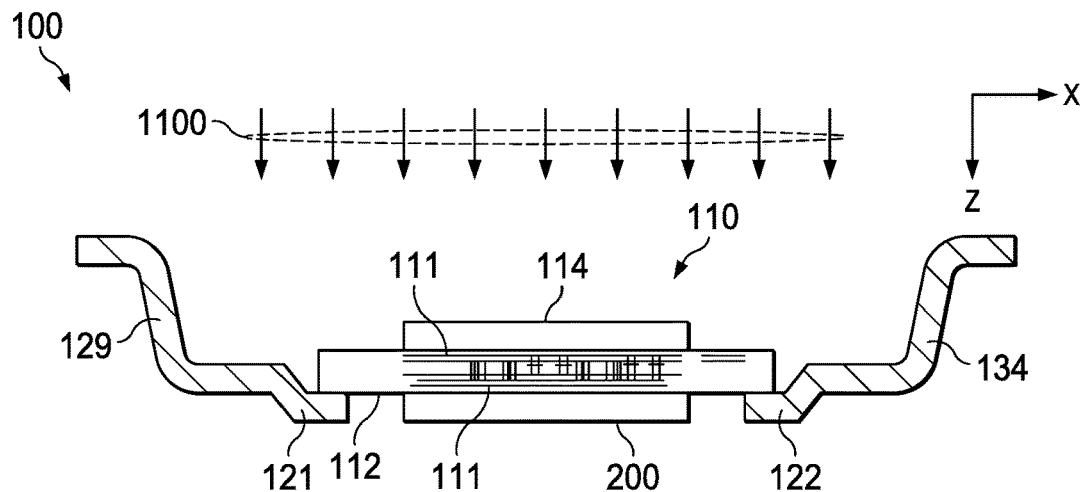

The method 700 continues at 710 with attaching the magnetic assembly to the conductive support structure (e.g., the first and second support members 121 and 122 in FIG. 1). FIG. 11 shows one example, in which an attachment process 1100 is performed that attaches the lamination structure 112 of the magnetic assembly 110 to corresponding surfaces of the first and second conductive support members 121 and 122. Any suitable attachment process 1100 can be used, such as application of adhesive, joining the components, and any necessary curing. In another example, conductive features of the lamination structure 112 can be soldered to the conductive support members 121 and 122.

Figure 7:
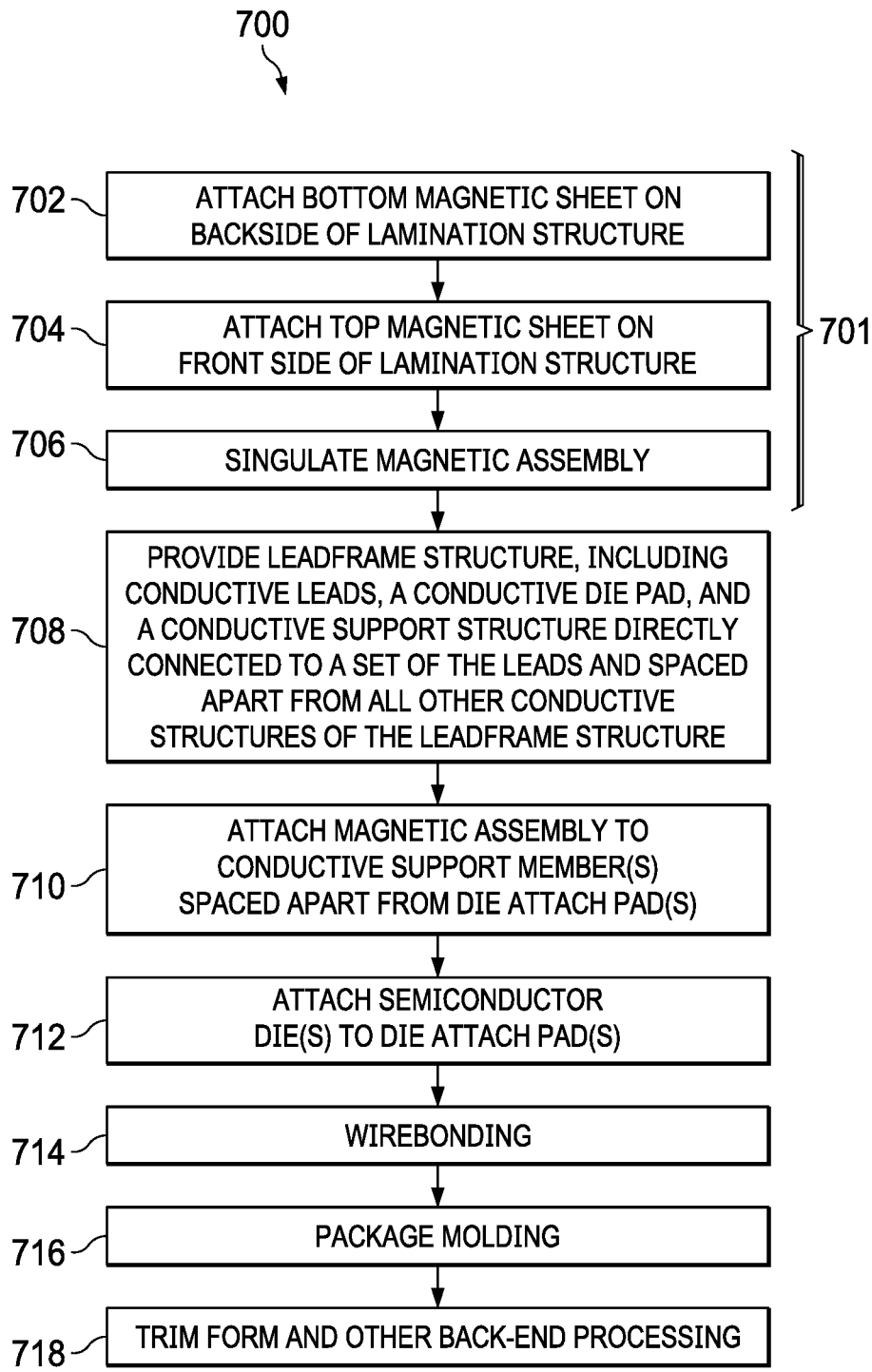
FIG. 7 is a flow diagram of a method of fabricating an electronic device.
Figure 12:
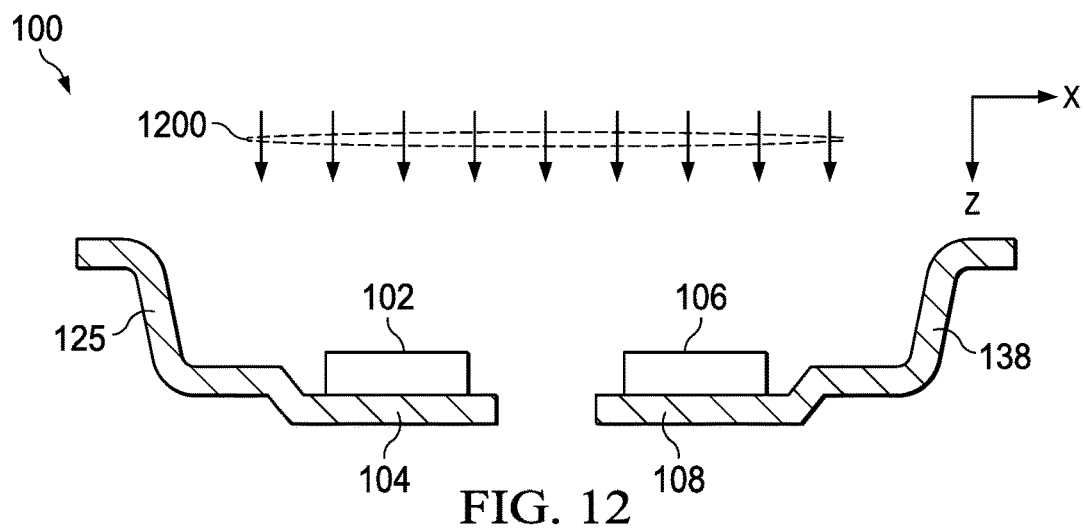

The process 700 continues at 712 in FIG. 7 with attaching one or more semiconductor dies to corresponding die attach pads. FIG. 12 shows one example in which a die attach process 1200 is performed that attaches the first semiconductor die 102 to the first die attach pad 104 (e.g., where the die attach pad 104 is one continuous conductive structure that includes the lead 125). In the illustrated example, the process 1200 also attaches the second semiconductor die 106 to the corresponding second die attach pad 108 (e.g., one continuous conductive structure that also includes the lead 138).

Figure 13:
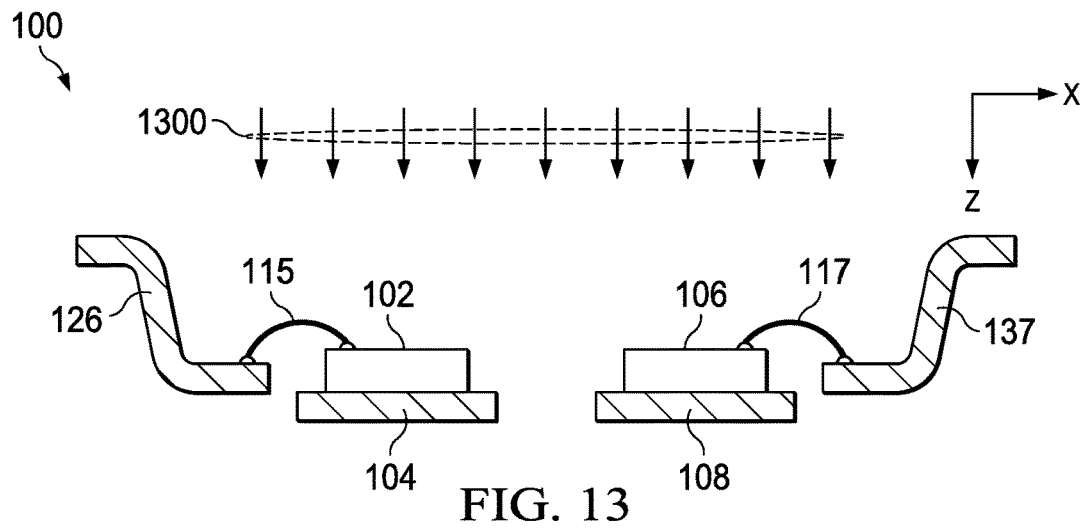

The example method 700 also includes wire bonding or other interconnection processing at 714. FIG. 13 shows one example in which a wire bonding process 1300 is performed that forms connections between the semiconductor die or dies and one or more conductive leads or conductive features of the magnetic assembly 110. In the example device 100, the connection process 1300 includes forming a first bond wire connection 115 between a first conductive feature of the first semiconductor die 102 and the conductive lead 126, forming a second bond wire connection 116 between a second conductive feature of the first semiconductor die 102 and a conductive feature of the magnetic assembly 110. The example process 1300 also includes forming a third bond wire connection 117 between a first conductive feature of the second semiconductor die 106 and the conductive lead 137, and forming a fourth bond wire connection 118 between a second conductive feature of the second semiconductor die 106 and a second conductive feature of the magnetic assembly 110. Further connections can be made at 714 for a particular design, for example, to connect multiple secondary windings and a primary winding of the magnetic assembly 110 to various conductive features of one or more of the semiconductor dies 102, 106 and/or between the semiconductor dies 102, 106, and/or between the semiconductor dies 102, 106 and various conductive leads of the device 100, etc.

Unlike other magnetic assembly support techniques in which laminate wire bond pads can be supported with a bottom magnetic core structure on a solid die attach pad, the example device 100 provides a suspended attachment of the magnetic assembly 110 to the conductive support structure, that facilitates increased spacing between high and low voltage domain features of the device 100, and corresponding reduction in electric field levels during operation and manufacturing testing of the device 100. In certain examples, the wire bonding or other interconnection processing at 714 can be performed using supporting structures to provide mechanical structural support for one or more features of the magnetic assembly 110 during bond wire attachment. In one example, one or both of the magnetic core structures 114, 200 can be supported with a custom bond wire clamping tool (not shown) during bond wire soldering operations. In one example, the bond wire clamping tool can include a cavity to support the laminate bond pad area that extends beyond the supported magnetic core structure.

The method 700 continues at 716 with formation of a final package structure. In one example, the packaging at 716 includes performing a molding process (not shown) that forms the package structure 122 in close the conductive die pads 104, 108, the conductive support structure members 121, 122, the semiconductor dies 102, 106, the magnetic assembly 110, and portions of the conductive leads 124-139. FIGS. 1-6 above show an example molded plastic package structure 120 formed at 716 in FIG. 7. In another example, a ceramic package structure can be formed at 716. At 718 in FIG. 7, further backend processing can be performed, such as form trimming, etc.

Described packaged electronic devices 100 and fabrication methods 700 solve problems in asymmetrical laminated magnetic assemblies by providing a suspended mounting for the magnetic assembly 110 in a symmetrical configuration. In the illustrated examples, the lamination structure 112 is vertically and laterally centered within the package structure 120, and the support members 121 and 122 facilitate increased spacing between high-voltage and low-voltage domains within the packaged electronic device 100. The support structure of the disclosed examples also mitigates mold filling the features associated with increased stack height of the integrated magnetics. The described devices and methods are also scalable for different designs, unlike attempts to increase feature spacing in asymmetrical die attach pad mounting approaches.

Modifications are possible in the described embodiments, and other embodiments are possible, within the scope of the claims.

The following is claimed:

1. A packaged electronic device, comprising:
   a leadframe structure, including:
      a plurality of conductive leads,
      a conductive die pad directly connected to a first set of the conductive leads, and
      a conductive support structure directly connected to a second set of the conductive leads, and spaced apart from all other conductive structures of the leadframe structure;
   a semiconductor die attached to the conductive die pad;
   a magnetic assembly attached to the conductive support structure; and
   a package structure that encloses the conductive die pad, the conductive support structure, the semiconductor die, the magnetic assembly and portions of the conductive leads.

2. The packaged electronic device of claim 1,
   wherein the leadframe structure further includes a second conductive die pad directly connected to a third set of the conductive leads, and spaced apart from the conductive support structure; and
   wherein the packaged electronic device further includes a second semiconductor die attached to the second conductive die pad.

3. The packaged electronic device of claim 2, further comprising:
   a first bond wire connected between the semiconductor die and a first conductive lead of the conductive leads;
   a second bond wire connected between the semiconductor die and the magnetic assembly;
   a third bond wire connected between the second semiconductor die and a second conductive lead of the conductive leads; and
   a fourth bond wire connected between the second semiconductor die and the magnetic assembly.

4. The packaged electronic device of claim 2,
   wherein the package structure includes a first lateral side and an opposite second lateral side;
   wherein portions of the individual conductive leads extend outward from the package structure along a corresponding one of the first and second lateral sides; and
   wherein the magnetic assembly is centered between the first and second lateral sides.

5. The packaged electronic device of claim 1,
   wherein the package structure includes a first lateral side and an opposite second lateral side;
   wherein portions of the individual conductive leads extend outward from the package structure along a corresponding one of the first and second lateral sides; and
   wherein the magnetic assembly is centered between the first and second lateral sides.

6. The packaged electronic device of claim 1,
   wherein the package structure includes a top side and an opposite bottom side;
   wherein the magnetic assembly includes a lamination structure, including a patterned conductive feature that forms a part of a passive electronic component; and
   wherein the lamination structure is centered between the top and bottom sides.

7. A packaged electronic device, comprising:
   a leadframe structure, including:
      a plurality of conductive leads,
      a conductive die pad directly connected to a first set of the conductive leads, and
      a conductive support structure directly connected to a second set of the conductive leads, and spaced apart from all other conductive structures of the leadframe structure;
   a semiconductor die attached to the conductive die pad;
   a magnetic assembly attached to the conductive support structure;
   a package structure that encloses the conductive die pad, the conductive support structure, the semiconductor die, the magnetic assembly and portions of the conductive leads;
   wherein the leadframe structure further includes a second conductive die pad directly connected to a third set of the conductive leads, and spaced apart from the conductive support structure;
   wherein the packaged electronic device further includes a second semiconductor die attached to the second conductive die pad;
   wherein the conductive support structure includes:
      a first conductive support member directly connected to a first group of the second set of the conductive leads, and spaced apart from all other conductive structures of the leadframe structure, and
      a second conductive support member directly connected to a second group of the second set of the conductive leads, and spaced apart from all other conductive structures of the leadframe structure; and
   wherein the magnetic assembly is attached to the first and second conductive support members.

8. The packaged electronic device of claim 7,
wherein the magnetic assembly includes:
a lamination structure, including a patterned conductive feature that forms a part of a passive electronic component,
a first core structure attached to a first side of the lamination structure, and
a second core structure attached to a second side of the lamination structure; and
wherein the lamination structure is attached to the first and second conductive support members.

9. The packaged electronic device of claim 7,
wherein the package structure includes a first lateral side and an opposite second lateral side;
wherein portions of the individual conductive leads extend outward from the package structure along a corresponding one of the first and second lateral sides; and
wherein the magnetic assembly is centered between the first and second lateral sides.

10. A packaged electronic device, comprising:
a leadframe structure, including:
a plurality of conductive leads,
a conductive die pad directly connected to a first set of the conductive leads, and
a conductive support structure directly connected to a second set of the conductive leads, and spaced apart from all other conductive structures of the leadframe structure, wherein the conductive support structure includes:
a first conductive support member directly connected to a first group of the second set of the conductive leads, and spaced apart from all other conductive structures of the leadframe structure, and
a second conductive support member directly connected to a second group of the second set of the conductive leads, and spaced apart from all other conductive structures of the leadframe structure;
a semiconductor die attached to the conductive die pad;
a magnetic assembly attached to the conductive support structure, wherein the magnetic assembly is attached to the first and second conductive support members; and
a package structure that encloses the conductive die pad, the conductive support structure, the semiconductor die, the magnetic assembly and portions of the conductive leads.

11. A packaged electronic device, comprising:
a leadframe structure, including:
a plurality of conductive leads,
a conductive die pad directly connected to a first set of the conductive leads, and
a conductive support structure directly connected to a second set of the conductive leads, and spaced apart from all other conductive structures of the leadframe structure;
a semiconductor die attached to the conductive die pad;
a magnetic assembly attached to the conductive support structure, wherein the magnetic assembly includes:
a lamination structure, including a patterned conductive feature that forms a part of a passive electronic component,
a first core structure attached to a first side of the lamination structure, and
a second core structure attached to a second side of the lamination structure, wherein the lamination structure is attached to the conductive support structure; and
a package structure that encloses the conductive die pad, the conductive support structure, the semiconductor die, the magnetic assembly and portions of the conductive leads.

12. A device, comprising:
a conductive die pad directly connected to a first set of conductive leads of a leadframe structure;
a semiconductor die attached to the conductive die pad;
a conductive support structure directly connected to a second set of conductive leads, and spaced apart from all other conductive structures of the leadframe structure;
a magnetic assembly, including a lamination structure attached to the conductive support structure; and
a molded package structure that encloses the conductive die pad, the conductive support structure, the semiconductor die, the magnetic assembly and portions of the conductive leads, the molded package structure including a top side, and an opposite bottom side, wherein the lamination structure is centered between the top and bottom sides.

13. The device of claim 12,
wherein the package structure includes a first lateral side and an opposite second lateral side;
wherein portions of the individual conductive leads extend outward from the package structure along a corresponding one of the first and second lateral sides; and
wherein the magnetic assembly is centered between the first and second lateral sides.

14. The device of claim 12,
wherein the leadframe structure further includes a second conductive die pad directly connected to a third set of the conductive leads, and spaced apart from the conductive support structure; and
wherein the device further includes a second semiconductor die attached to the second conductive die pad.

15. The device of claim 14, further comprising:
a first bond wire connected between the semiconductor die and a first conductive lead of the conductive leads;
a second bond wire connected between the semiconductor die and the magnetic assembly;
a third bond wire connected between the second semiconductor die and a second conductive lead of the conductive leads; and
a fourth bond wire connected between the second semiconductor die and the magnetic assembly.

16. The device of claim 14,
wherein the package structure includes a first lateral side and an opposite second lateral side;
wherein portions of the individual conductive leads extend outward from the package structure along a corresponding one of the first and second lateral sides; and
wherein the magnetic assembly is centered between the first and second lateral sides.

17. The device of claim 12,
wherein the package structure includes a top side and an opposite bottom side;
wherein the magnetic assembly includes a lamination structure, including a patterned conductive feature that forms a part of a passive electronic component; and wherein the lamination structure is centered between the top and bottom sides.

18. A device, comprising:
a conductive die pad directly connected to a first set of conductive leads of a leadframe structure;
a semiconductor die attached to the conductive die pad;
a conductive support structure directly connected to a second set of conductive leads, and spaced apart from all other conductive structures of the leadframe structure;
a magnetic assembly, including a lamination structure attached to the conductive support structure,
wherein the conductive support structure includes:
  a first conductive support member directly connected to a first group of the second set of the conductive leads, and spaced apart from all other conductive structures of the leadframe structure, and
  a second conductive support member directly connected to a second group of the second set of the conductive leads, and spaced apart from all other conductive structures of the leadframe structure, wherein the lamination structure is attached to the first and second conductive support members; and
a molded package structure that encloses the conductive die pad, the conductive support structure, the semiconductor die, the magnetic assembly and portions of the conductive leads, the molded package structure including a top side, and an opposite bottom side, wherein the lamination structure is centered between the top and bottom sides.

19. The device of claim 18,
wherein the magnetic assembly includes:
  a lamination structure, including a patterned conductive feature that forms a part of a passive electronic component,
  a first core structure attached to a first side of the lamination structure, and
  a second core structure attached to a second side of the lamination structure; and
wherein the lamination structure is attached to the first and second conductive support members.

20. A device, comprising:
a conductive die pad directly connected to a first set of conductive leads of a leadframe structure;
a semiconductor die attached to the conductive die pad;
a conductive support structure directly connected to a second set of conductive leads, and spaced apart from all other conductive structures of the leadframe structure, wherein the conductive support structure includes:
  a first conductive support member directly connected to a first group of the second set of the conductive leads, and spaced apart from all other conductive structures of the leadframe structure, and
  a second conductive support member directly connected to a second group of the second set of the conductive leads, and spaced apart from all other conductive structures of the leadframe structure;
a magnetic assembly, including a lamination structure attached to the conductive support structure, wherein the magnetic assembly is attached to the first and second conductive support members; and
a molded package structure that encloses the conductive die pad, the conductive support structure, the semiconductor die, the magnetic assembly and portions of the conductive leads, the molded package structure including a top side, and an opposite bottom side, wherein the lamination structure is centered between the top and bottom sides.

21. A device, comprising:
a conductive die pad directly connected to a first set of conductive leads of a leadframe structure;
a semiconductor die attached to the conductive die pad;
a conductive support structure directly connected to a second set of conductive leads, and spaced apart from all other conductive structures of the leadframe structure;
a magnetic assembly, including a lamination structure attached to the conductive support structure, wherein the magnetic assembly includes:
  a lamination structure, including a patterned conductive feature that forms a part of a passive electronic component,
  a first core structure attached to a first side of the lamination structure, and
  a second core structure attached to a second side of the lamination structure,
wherein the lamination structure is attached to the conductive support structure; and
a molded package structure that encloses the conductive die pad, the conductive support structure, the semiconductor die, the magnetic assembly and portions of the conductive leads, the molded package structure including a top side, and an opposite bottom side, wherein the lamination structure is centered between the top and bottom sides.

22. A device, comprising:
a conductive die pad directly connected to a first set of conductive leads;
a semiconductor die attached to the conductive die pad;
a conductive support structure directly connected to a second set of conductive leads and not to any of the first set of conductive leads, and spaced apart from the conductive die pad;
a magnetic assembly, including a lamination structure attached to the conductive support structure; and
a molded package structure that encloses the conductive die pad, the conductive support structure, the semiconductor die, the magnetic assembly and portions of the conductive leads, the molded package structure including a top side, and an opposite bottom side, wherein the lamination structure is centered between the top and bottom sides.

* * * * *